US 6,597,010 B2

(12) United States Patent
Eriksson et al.

(10) Patent No.: US 6,597,010 B2
(45) Date of Patent: Jul. 22, 2003

(54) SOLID-STATE QUANTUM DOT DEVICES AND QUANTUM COMPUTING USING NANOSTRUCTURED LOGIC GATES

(75) Inventors: Mark A. Eriksson, Madison, WI (US); Mark G. Friesen, Middleton, WI (US); Robert J. Joynt, Madison, WI (US); Max G. Lagally, Madison, WI (US); Daniel W. van der Weide, Madison, WI (US); Paul Rugheimer, Madison, WI (US); Donald E. Savage, Madison, WI (US)

(73) Assignee: Wisconsin Alumni Research Foundation, Madison, WI (US)

(*) Notice: Subject to any disclaimer, the term of this patent is extended or adjusted under 35 U.S.C. 154(b) by 0 days.

(21) Appl. No.: 10/093,960

(22) Filed: Mar. 8, 2002

(65) Prior Publication Data

US 2002/0179897 A1 Dec. 5, 2002

Related U.S. Application Data

(60) Provisional application No. 60/274,853, filed on Mar. 9, 2001.

(51) Int. Cl.[7] .............................................. H01L 29/06
(52) U.S. Cl. ............................ 257/14; 257/14; 257/9; 257/12; 257/17; 257/20
(58) Field of Search .......................... 257/14, 9, 12, 257/192, 31, 17, 20; 371/40.11; 712/1

(56) References Cited

U.S. PATENT DOCUMENTS

| | | | | |
|---|---|---|---|---|
| 5,243,206 A | * | 9/1993 | Zhu et al. ................... | 257/192 |
| 5,530,263 A | | 6/1996 | DiVencenzo | |
| 5,671,437 A | | 9/1997 | Taira | |
| 5,677,637 A | | 10/1997 | Nakazato et al. | |
| 5,714,766 A | | 2/1998 | Chen et al. | |
| 5,768,287 A | * | 6/1998 | Norman et al. ............. | 714/719 |
| 5,917,322 A | | 6/1999 | Gershenfeld et al. | |
| 6,081,882 A | * | 6/2000 | Gossett ....................... | 712/1 |
| 6,177,684 B1 | | 1/2001 | Sugiyama | |
| 6,459,097 B1 | * | 10/2002 | Zagoskin ..................... | 257/31 |

OTHER PUBLICATIONS

R.C. Ashoori, et al, "Single–Electron Capacitance Spectroscopy of Discrete Quantum Levels," Physical Review Letters, vol. 68, No. 20, May 18, 1992, pp. 3088–3091.

B.E. Kane, "A Silicon–Based Nuclear Spin Quantum Computer," Nature, vol. 393, May 14, 1998, pp. 133–137.

Guido Burkard, et al, "Coupled Quantum Dots as Quantum Gates," Physical Review B, vol. 59, No. 3, Jan. 15, 1999, pp. 2070–2078.

Rutger Vrijen, et al, "Electron–Spin–Resonance Transitors for Quantum Computing in Silicon–Germanium Heterostructures," Physical Review A, vol. 62, 2000, pp. 12306–1—012306–10.

Justin Mullins, "The Topsy Turvy World of Quantum Computing," IEEE Spectrum, Feb. 2001, pp. 42–49.

Jeremy Levy, "Quantum–Information Processing with Ferroelectrically Coupled Quantum Dots," Physical Review A, vol. 64, 2001, pp. 052306–1—052306–7.

Frisen, M., et al., "Modeling Interactions of Si–Ge Qubits," American Physical Society, Jan. 2001; available at http://www.eps.org/aps/meet/MAR01/baps/abs/S3640004.html.

* cited by examiner

Primary Examiner—David Nelms
Assistant Examiner—Thinh T. Nguyen
(74) Attorney, Agent, or Firm—Foley & Lardner

(57) ABSTRACT

Semiconductor dot devices include a multiple layer semiconductor structure having a substrate, a back gate electrode layer, a quantum well layer, a tunnel barrier layer between the quantum well layer and the back gate, and a barrier layer above the quantum well layer. Multiple electrode gates are formed on the multi-layer semiconductor with the gates spaced from each other by a region beneath which quantum dots may be defined. Appropriate voltages applied to the electrodes allow the development and appropriate positioning of the quantum dots, allowing a large number of quantum dots be formed in a series with appropriate coupling between the dots.

43 Claims, 14 Drawing Sheets

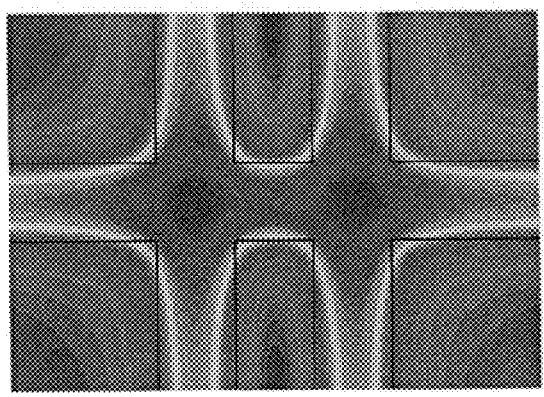 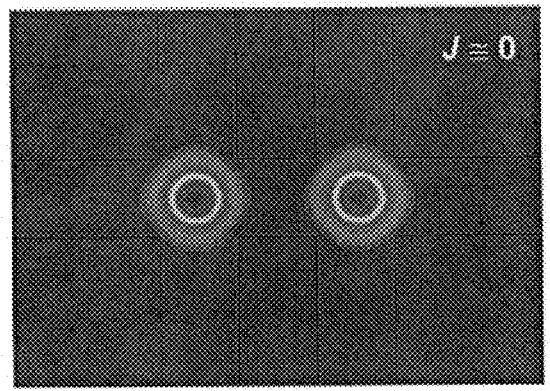
Fig. 14                              Fig. 15

SOLID-STATE QUANTUM DOT DEVICES AND QUANTUM COMPUTING USING NANOSTRUCTURED LOGIC GATES

REFERENCE TO RELATED APPLICATION

This application claims the benefit of provisional application No. 60/274,853, filed Mar. 9, 2001, the disclosure of which is incorporated by reference.

STATEMENT OF GOVERNMENT RIGHTS

This invention was made with United States government support awarded by the following agencies: ARMY DAAD19-01-1-0515 and DOD ARPA F33615-00-1-1720. The United States has certain rights in this invention.

FIELD OF THE INVENTION

This invention pertains generally to the field of semiconductor devices and to quantum computing carried out in semiconductor devices.

BACKGROUND OF THE INVENTION

Quantum computing utilizes quantum particles to carry out computational processes. The fundamental unit of quantum information is called a quantum bit or qubit. A qubit can be both a zero and a one at the same time. An example is the spin of an electron, wherein the up or down spin can correspond to a zero, a one, or a superposition of states in which it is both up and down at the same time. Performing a calculation using the electron essentially performs the operation simultaneously for both a zero and a one. Experimental advances in quantum computation have come most rapidly in nuclear magnetic resonance (NMR) and ion-trap systems. The success of few-qubit quantum computation in such systems demonstrates an urgent need for a quantum computing scheme that is scaleable to a large number of qubits. Solid-state qubits are one of the primary candidates. Numerous proposals have been made for solid-state quantum computers. These proposals include the use of nuclear spins as qubits, B. E. Kane, "A Silicon-Based Nuclear Spin Quantum Computer," Nature, Vol. 393 (6681), 1998, pp. 133–137; and the use of electronic spins as quantum dots, DiVincenzo, et al., "Quantum Computers and Quantum Coherence," J. of Magnetism and Magnetic Materials, Vol. 200, (1–3), 1999, pp. 202–218. Potential issues with such proposed systems include individual impurity spins, as well as gate operation and readout methods for the quantum dots.

Spins can be manipulated using a strong DC magnetic field combined with a spatially uniform radio frequency (i.e., at GHz frequencies) field. In the presence of a small g-factor gradient, the spins can be addressed individually. Entanglement of one spin with another proceeds by gating the barrier between spins. This gives rise to a time-dependent exchange interaction, $H(t)=J(t)S_1 \cdot S_2$. A combination of these operations acting in the proper sequence on two qubits will produce a controlled-NOT gate (C-NOT). See, e.g., R. Vrijen, et al., "Electron-Spin Resonance Transistors for Quantum Computing and Silicon-Germanium Heterostructures," Physical Review A (Atomic, Molecular, and Optical Physics), Vol. 62 (1), 2000, pp. 012306/1–10.

Quantum computation also can be performed without g-factor tuning and the individual spin rotations via high frequency radiation that g-factor tuning allows. Instead, the time-dependent exchange interaction, $H(t)=J(t)S_1 \cdot S_2$, can be used in combination with coded qubits, D. P. DiVincenzo, D. Bacon, J. Kempe, G. Burkard, K. B. Whaley, *Nature* (London) 408, 339 (2000), in which a single qubit is represented by the total wavefunction of several individual spins. In this way, the exchange interaction alone enables universal quantum computation.

SUMMARY OF THE INVENTION

In accordance with the present invention, electron quantum dot semiconductor devices may be utilized for such purposes as quantum computing, quantum memory, and quantum information processing. The invention may be implemented in a semiconductor heterostructure to trap individual electrons in a solid, bring these electrons close to each other, maintain phase coherence of the electrons, and allow individual rotation of the spin of the electrons.

A semiconductor quantum dot device in accordance with the invention includes a multiple layer semiconductor structure having a quantum well, a back gate electrode, and a plurality of spaced surface electrode gates. The electrode gates are spaced from each other by a region beneath which quantum dots may be defined. A tunnel barrier layer is provided between the back gate and the quantum well, and a barrier layer is formed over the quantum well layer. Appropriate voltages applied to the electrodes allow the development and appropriate positioning of the quantum dots. This arrangement in accordance with the invention allows a large number of quantum dots, each containing as few as one electron, to be formed in a series with appropriate coupling between the quantum dots, enabling quantum computation with a large number of qubits. In addition to the embodiment of the present invention in a quantum computer, the invention may also be implemented in other applications such as a single electron transistor and in integrated circuit technologies where control of one or a few electrons is desired.

The heterostructure and split top gates that enable the creation of coupled quantum dots may also be used to channel electrons across an integrated circuit. In this mode of operation, the invention provides a local tuning of the potential in a quantum well to provide channels in which individual electrons can be moved through a series of devices enabling, for example, readout of quantum memory.

Further objects, features and advantages of the invention will be apparent from the following detailed description when taken in conjunction with the accompanying drawings.

BRIEF DESCRIPTION OF THE DRAWINGS

In the drawings:

FIG. 14 is a computed map of electrostatic potential for the device of FIG. 9 at the point B of the FIG. 11, computed at the middle of the quantum well.

FIG. 15 is a computed map of charge density for the device of FIG. 9 at the point B of FIG. 11, computed at the middle of the quantum well.

DETAILED DESCRIPTION OF THE INVENTION

The present invention enables the fabrication of single electron quantum dots, or few electron quantum dots, in semiconductors in a manner that will simultaneously allow coupling between many adjacent dots. The invention provides a spin-based qubit for quantum computation, and allows the measurement of individual spin states in small quantum dots. The invention provides advantages in coupling low-occupation quantum dots, such as in quantum dot cellular automata, and enables coupling of multiple single electron or whole dots together to allow tunneling between adjacent dots.

Figure 2:
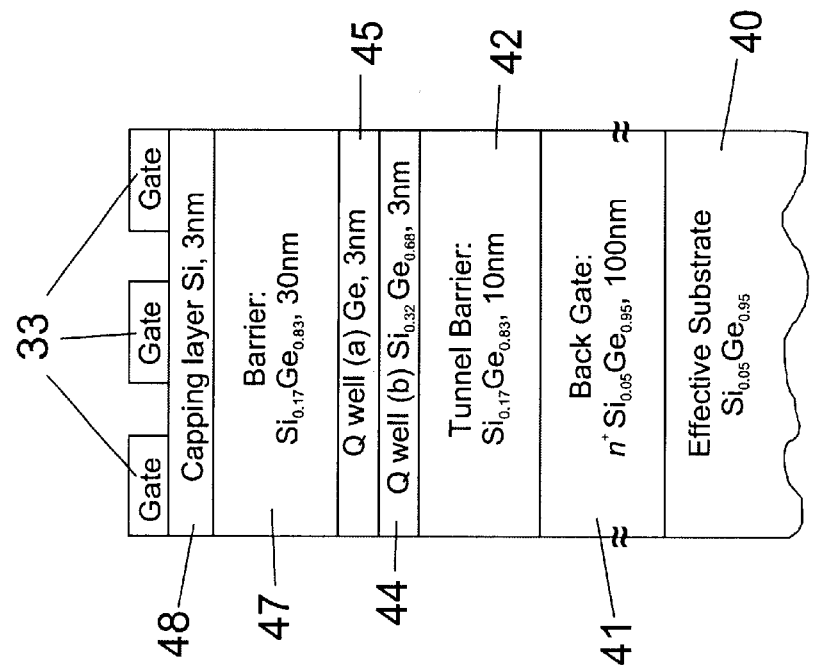
FIG. 2 is a simplified cross-sectional view of an exemplary SiGe based semiconductor device of the type shown in FIG. 1 taken generally along the lines 2—2 of FIG. 1.
Figure 1:
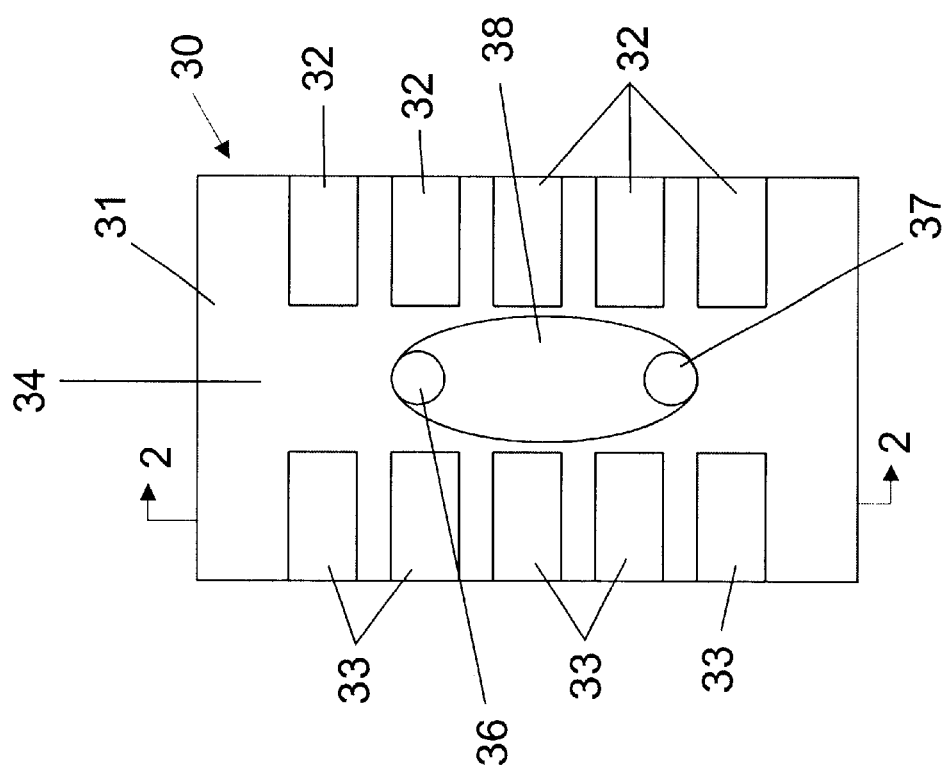
FIG. 1 is a partial plan view of a quantum dot semiconductor device in accordance with the present invention.
Figure 3:
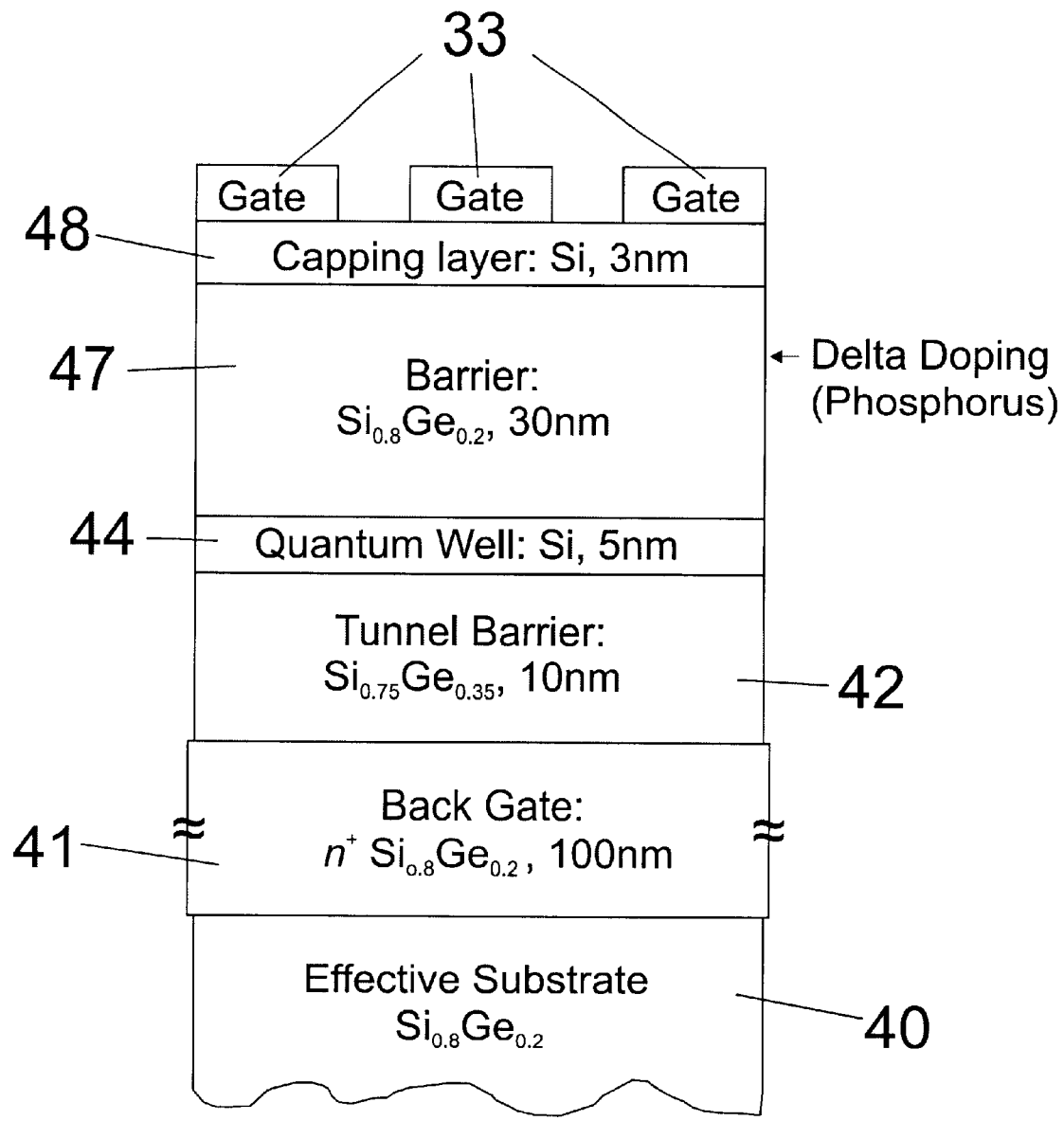
FIG. 3 is a simplified cross-sectional view of another exemplary SiGe semiconductor device of the type shown in FIG. 1 taken generally along the lines 2—2 of FIG. 1.
Figure 4:
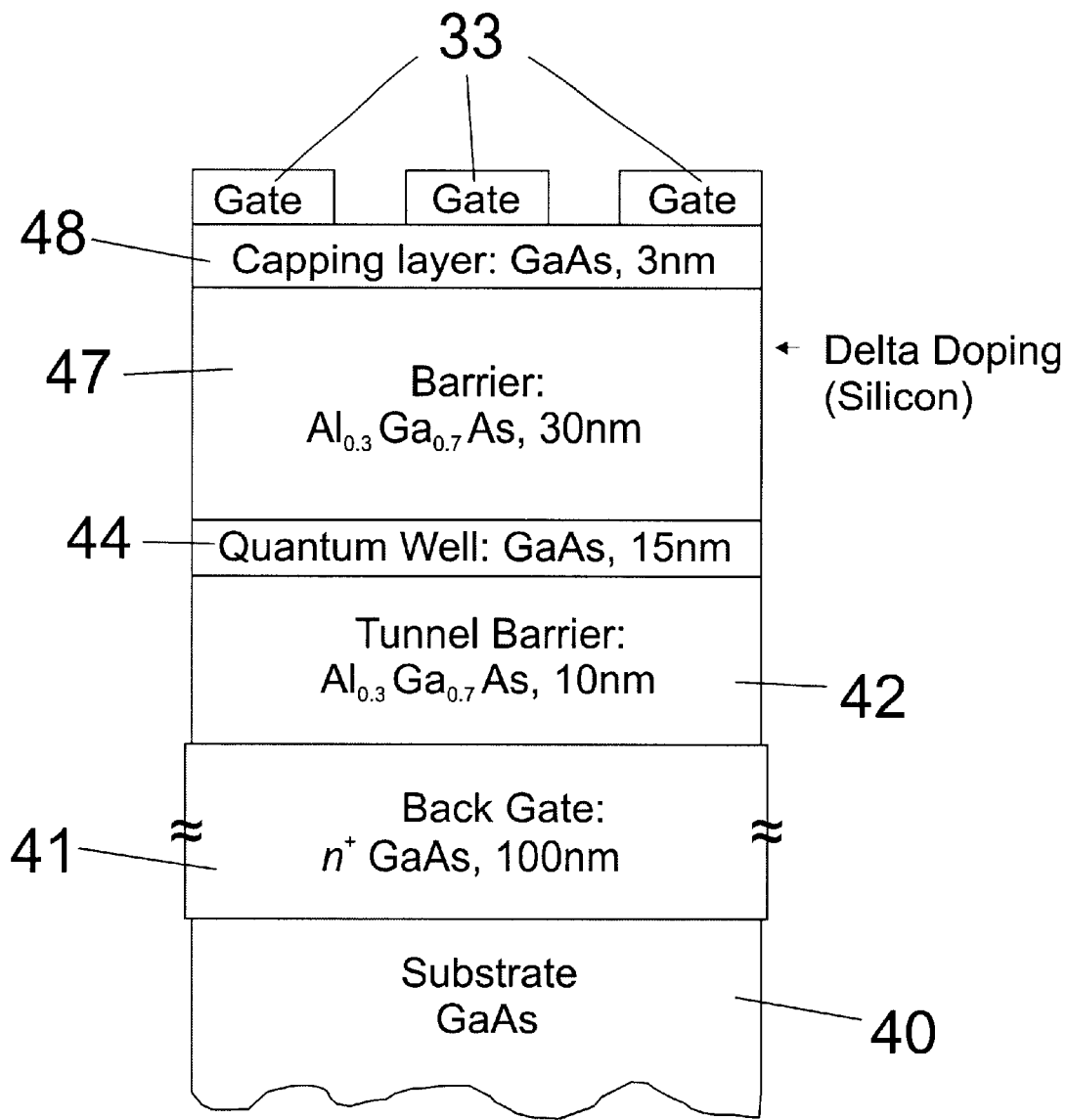
FIG. 4 is a simplified cross-sectional view of an exemplary GaAs\AlGaAs based semiconductor device of the type shown in FIG. 1 taken generally along the lines 2—2 of FIG. 1.

An exemplary semiconductor device providing quantum dot interaction in accordance with the invention is shown generally at 30 in FIG. 1 and examples of material systems for the device 30 are shown in cross-sections in FIGS. 2, 3, and 4. The device of FIG. 1 includes a semiconductor structure 31 on which are formed a plurality of surface electrode gates 32 and 33, i.e., at least one gate 32 and one gate 33, which are separated from each other by an intergate region 34 as shown in FIG. 1, multiple spaced gates 32 and 33 may be utilized to allow two quantum dots 36 and 37 to be defined. The quantum dots 36 and 37 are separated by a tunable coupling region 38. As shown in the cross-sectional views of FIGS. 2, 3, and 4, the semiconductor structure 31 is preferably a heterostructure that includes an effective substrate 40, a highly doped and conductive back gate 41, and a tunnel barrier 42 formed on the back gate. A first quantum well layer 44 and optionally, a second quantum well layer 45 are formed between the lower barrier layer 42 and an upper spacer or barrier layer 47 (e.g., 30 nm thick). Alternatively, the layers 44 and 45 may be combined into a single layer 44 as shown in FIGS. 3 and 4. In this case, the composition of the single layer (44, 45) may be chosen to maximize spin coherence, or to fine tune the band offsets. A capping layer 48 of, e.g., Si, is formed over the upper layer barrier 47, and the gates (gates 33 are shown in FIG. 2) formed, e.g., of gold or other metal, are deposited on the top of the capping layer 48. As used herein, a heterostructure is a series of epitaxial layers that may be chosen to allow electron or hole confinement in one or more of the layers. Epitaxial means that that the crystal structure is not interrupted at the interface between layers.

Each of the layers described above in the semiconductor heterostructure may be made of various materials. For example, the substrate, the back gate, and the tunnel barrier may all be made from SiGe. A double layer quantum well may be made of a first layer of SiGe and a second layer of Ge. Alternatively, the quantum well may be a single layer of 100% Si in order to maximize spin coherence, or may be made of a layer of SiGe in order to fine tune the band offsets. Finally, the capping layer may be a layer of Si. Such embodiments are shown in FIGS. 2 and 3. Alternatively, the substrate, the back gate, and the quantum well may each be made from GaAs and the tunnel barrier and the upper spacer layer may be made of AlGaAs. In this configuration, a capping layer of GaAs is formed over the upper barrier 47. FIG. 4 depicts such a semiconductor heterostructure. Exemplary layer thicknesses and compositions for the multilayer heterostructures 31 are shown in FIGS. 2–4 (not drawn to scale). These material systems are shown for purposes of illustration, and it is understood that other material systems may be utilized. Preferably, the spacing between the quantum well layer 45 and the gates 32 and 33 at the top of the heterostructure is in the range of about 30 to 50 nm (e.g., 33 nm as shown in FIGS. 2–4), and the preferred spacing between the gate electrodes 32 and 33, and between adjacent electrodes 32 and adjacent electrodes 33, is in the range of about 10 nm to 50 nm.

The qubit in the device 30 is the spin of a single electron (or possibly several electrons) in the quantum dots 36 and 37. The heterostructure 31 provides a SiGe field effect transistor (FET) structure that confines the electrons in a direction perpendicular to the layers and the device surface, while the gates 32 and 33 provide lateral confinement. A readable controlled-NOT (C-NOT) gate utilizes three such dots in a row at a separation of about 100 nm between dots. All of the dots may be prepared in the "up" state by thermal relaxation in a field. The first dot 36 may be the control dot (DOT 1) and the second dot 37 may be the target dot (DOT 2). The two dots may be manipulated individually utilizing GHz pulses. When the barrier between the two dots is partially lowered, the spin-spin interaction, $H(t)=J(t)S_1 \cdot S_2$ ($S_1$ is the spin of a DOT 1 and $S_2$ is a spin of DOT 2) is tuned so that J(t) can be chosen. This interaction entangles the spins of the two dots. J(t) can then be controlled, as well as a single qubit operation, to allow performance of a set of operations including the universal controlled-NOT gate. A third dot (DOT 3, not shown in FIG. 1) functions as the readout dot. If the barrier between DOT 1 and DOT 3 is lowered (by a relatively large amount), tunneling can be induced from DOT 2 to DOT 3. A measurement of the energy required to induce the tunneling determines whether DOT 2 was in a spin-up or spin-down state. This measurement is "strong" in the sense that it is sufficient to allow a final readout of a quantum computation. This arrangement can be scaled up to a large number of dots (e.g., tens, hundreds or more) utilizing standard lithography techniques.

For clarification, it is noted that the term "gates" is used herein to refer to different types of structures. The surface gates 32 and 33 are metal films on the semiconductor surface which act like the gate of a field effect transistor. The surface gates can be patterned on very small scales, e.g., lateral dimension of 40 nm or less. The back gate 41 is a doped layer below the quantum dots, and acts as a metallic (highly conductive) plane for the purpose of electrostatically defining the dots. It is also the source of the electrons or holes in the dots. Both the surface gates and the back gates are physical entities. A quantum gate is an operation that is applied to the quantum bits (qubits). The quantum gate refers to these operations and can apply to the physical series of voltage pulses applied to one qubit to achieve the effect of a quantum gate. An example of a quantum gate is the controlled-NOT gate, or C-NOT gate.

The present invention has several advantages. Unlike some prior solid-state designs, the invention does not utilize impurities to bind individual electrons as qubits. Instead, it employs a new type of quantum dot that is optimized for single electron occupation. This is significant because it is not necessary to align gates to impurities at unknown locations, which is difficult to do in practice and would require unproven fabrication techniques. In addition, each qubit is a hole or electron trapped in a potential well, with the well formed vertically by means of band-edge engineering and laterally by electrostatic gates. In the present invention, a tunnel-coupled back gate (41) is incorporated into the semiconductor structure (31) that enables tuning of the number of carriers on the dot without regard to the lateral distance to the next nearest dot or lateral electron reservoir, thereby enabling robust few or single electron quantum dots (artificial impurities). Further, the invention preferably utilizes depletion gates (the gates 32 and 33) to define the qubit. These depletion gates cover a continuous conducting layer that is only subsequently pushed back through the back gate to reveal the final qubit. The symmetry of the present design also allows shifting of the qubit laterally by adjusting the position of each qubit's confinement well, enabling control of the Coulomb exchange coupling between qubits.

The invention can be implemented in any semiconductor heterostructure in which band structure engineering can be performed by composition or strain manipulation of the band gap in a sequence of layers.

The present invention meets the requirements for a successful solid-state quantum computing device because of its ability to manipulate and measure individual qubits. The manipulation and measurement are sensitive enough to detect individual qubits, are localized sufficiently to allow manipulation of neighboring qubits with negligible cross-contamination, and are fast compared with the decoherence time for individual qubits so that error correction can be efficient.

The state of the qubit is the state of a single spin in a solid-state environment. Detection of such spins by their magnetic moment alone is not currently practical. In the present invention, detection of individual charges can be carried out utilizing low-noise field effect transistors or single electron transistors, both of which have enough sensitivity to detect individual electron charges. Field effect transistors (FETs) are a natural choice for large-scale manufacturing. Single electron transistors are actually easier to fabricate for research because they can be fabricated in a single lithographic step.

Manipulation of solid-state spin qubits can proceed via two protocols. Single quantum dot qubit quantum computing involves two processes: the rotation of individual spins, and the coupling of adjacent spins via the exchange Coulomb interaction for specific periods of time at a known interaction strength. Coded qubit quantum computing uses several quantum dots to represent a single qubit, with the advantage that only the exchange Coulomb interaction is required, and single spin rotation is not required.

Manipulation of individual spins can be accomplished by tuning the g-factor of each spin, for example, by exploiting the different g-factors for electrons in Si ($g \approx 2$) and in Ge ($g \approx 1.6$). In the qubit device 30 of FIG. 2, electrons are confined in a silicon quantum well 44–45, with relaxed SiGe confinement barriers 42 and 47. It is possible to add a small vertical gradient of Ge in the mostly Si quantum well. Small changes in gate voltage which are insufficient to change the electron population of the qubit will nonetheless enable sufficient tuning of the electron g-factor to move its electron spin resonance line with respect to all of the other qubits. Coupling between adjacent qubits can be adjusted by controlling the position of the qubit, which is adjustable on the length scale of the inter-qubit spacing 38, and by tuning the barrier height between qubits. Such operations are made possible by the series of spaced gates 32 and 33 that define the qubit. Such flexibility for defining the quantum dot is a significant advantage of the present invention. Control of the exchange interaction requires characterization of each qubit, a process that can be automated under computer control to scale to large numbers of qubits.

The voltage manipulations and measurements must be performed at times which are relatively small compared to the decoherence times, which may be as large as seconds at low temperature. Practical computations require speeds that may be a million times faster than the decoherence times, such that localized electronics may be operated at MHz rates or higher. To operate the system at higher temperatures reduces the decoherence times, requiring faster control.

The following is an exemplary fabrication process for the quantum dot device 30 illustrated in FIGS. 1 and 2. It is understood that this process is exemplary only, and many variations are possible, for example, by the use of x-ray lithography or photolithography rather than the use of e-beam writing, by the use of a wide variety of etches, and so forth.

The first step is the growth of a semiconductor heterostructure 31 which confines a two-dimensional electron or hole layer in a quantum well located just above a back gate 41 and close enough to the back gate to allow tunneling between the back gate and the quantum well 44, 45. The quantum well may contain a gradient in composition to allow tuning of the g-factor by application of an applied voltage to the top gates 32 and 33.

A contact is formed to the back gate 41 without contacting the carriers in the quantum well. This may be accomplished by etching a region on the semiconductor chip structure, for example, by using photolithography followed by reactive ion etching or wet etches to a depth below the back gate 41, followed by forming an ohmic contact to the back gate.

Electron beam lithography may then be utilized to pattern an array of gates 32 and 33 as shown in FIG. 1. The gates may be fabricated by metal deposition and lift-off in a conventional manner.

The device 30 functions by applying selected voltages to the individual surface gates 32 and 33 with respect to the back gate 41. Electrostatic repulsion will cause carriers (holes or electrons) to be removed from the quantum well 44, 45 beneath the surface gates and in the surrounding areas. One or a few carriers will be left in the exposed regions 34 between the gates 32 and 33. These isolated areas become the quantum dots.

Figure 5:
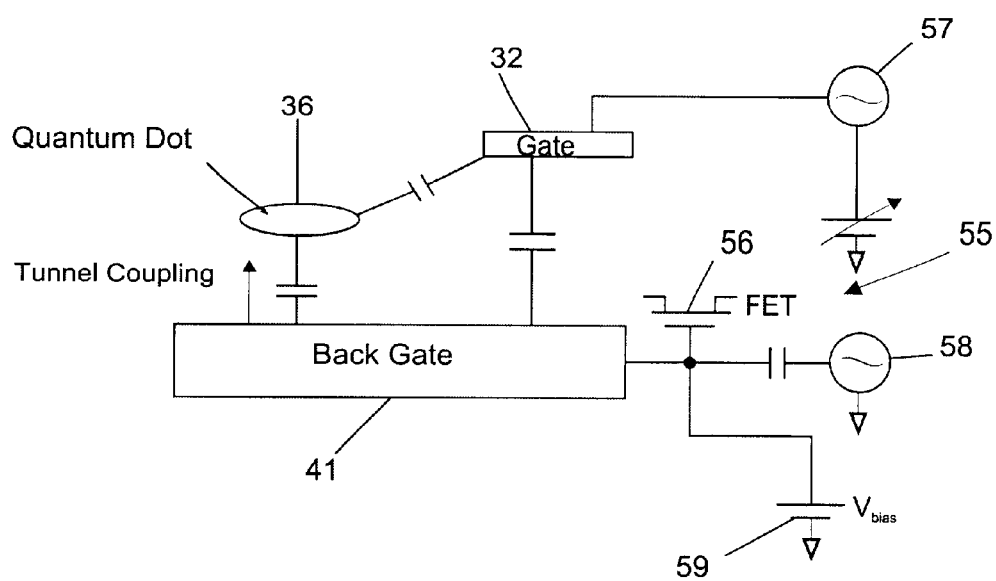
FIG. 5 is a schematic circuit diagram of a charge sensor connected to a quantum dot.

To allow readout from the device, a charge sensor 55 including a FET 56 may be connected as shown in FIG. 3, wherein selected voltages are applied to an electrode gate (e.g., one of the gates 32) from a source 57 which may include AC and DC voltage supplies as shown in FIG. 5. Preferably, selected voltages can be applied individually to each of the gates 32 and 33. A selected voltage is applied to the back gate 41 from a source 58, with a bias voltage being provided from a bias voltage supply 59 to the back gate. The purpose of the charge sensor 55 is to monitor the charge in the quantum dot and detect changes in charge. The circuit is an AC bridge which is balanced when no tunneling occurs to the dot, and the FET 56 then records no signal. When the gate voltage is adjusted to allow tunneling, excess charge flows from the back gate, and a signal charge is recorded on the FET. In small scale operation, the charge sensor can be a commercial field effect transistor 56 having its gate electrically connected to the gate 32 by a short wire. The FET can be attached to the back gate 41 in the case of a single quantum dot, as shown in FIG. 5, but would be attached to a top gate 32 or 33 adjacent to the dot of interest in the case of many dots coupled in a linear array.

Figure 6:
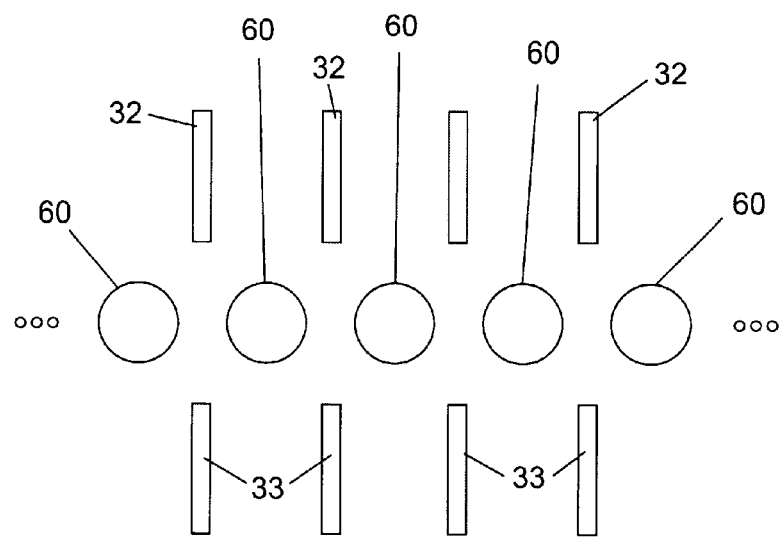
FIG. 6 is a diagram illustrating the manner in which qubits can be fabricated side-by-side to allow scaling up of a quantum computer to a large number of qubits.

An advantage of the present invention is its scalability. The foregoing fabrication steps do not limit the number of dots that may be fabricated in series, as illustrated by the multiple linearly aligned quantum dots 60 shown in FIG. 6. Although a linear coupling is shown, the chain of dots 60 can be curved to allow dense packing on a semiconductor chip. The gates 32 and 33 between dots allow tunable coupling which is necessary to produce the quantum gate operations. For a large scale operation, field effect transistors may be fabricated by standard silicon processing techniques and connected to the array of gates defining the dot. One FET per dot may be used to allow readout of the charge state of each dot. In every case, a single electron transistor can be utilized rather than a field-effect transistor.

The foregoing device is preferably formed to function at temperatures below 4.2 Kelvins, because of the increase in the spin coherence time at such temperatures.

It is noted that each quantum dot will be different from its neighbors and from every other dot, because of disorder in the semiconductor structure. For this reason, a computer may be utilized to characterize each qubit and to determine the voltages to be applied to each gate 32 and 33 to define the dots. Operations are performed by varying the voltages on the gates to control the exchange coupling between electrons or holes in adjacent dots, permitting universal quantum computation. In addition to the coupling between adjacent dots, single spin rotations may be achieved by tuning the g-factor of electrons to allow a radio frequency field to rotate each spin individually but coherently. This feature is not required in the coded qubit mode of operation.

Figure 7:
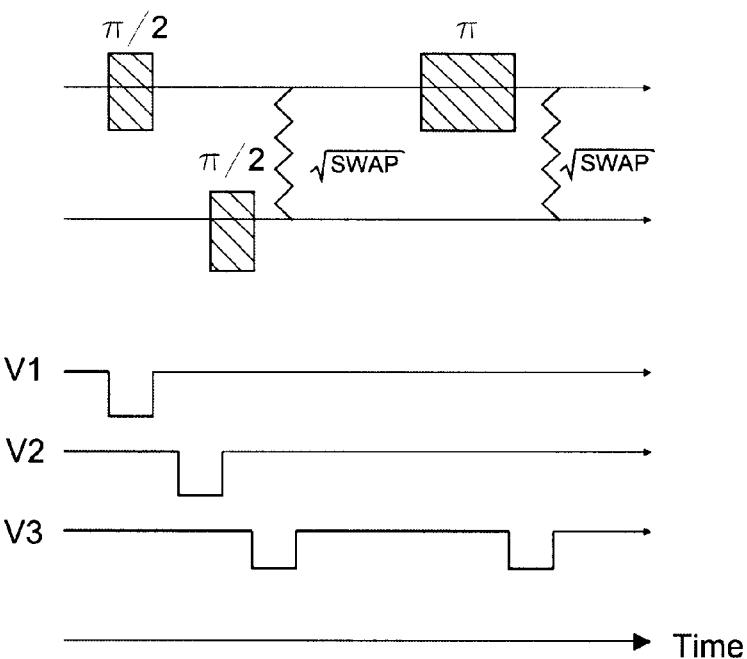
FIG. 7 are timing diagrams showing the time sequence for the operation of a C-NOT gate implemented utilizing the invention.

As noted above, construction of a readable control-NOT (C-NOT) gate uses three quantum dots in a row at a separation of about 100 nm between dots. All dots may be prepared in the "up" state by thermal relaxation in a field, where the first dot (Dot 1) is the control dot, the second dot (Dot 2) is the target dot, and the third dot (Dot 3) is the readout dot. Dots 1 and 2 can be manipulated individually by voltage pulses. When the barrier between Dots 1 and 2 is partially lowered, the spin-spin interaction is turned on such that J(t) can be chosen, which interaction entangles the spins of Dots 1 and 2. J(t), as well as the single bit qubit operation, is controlled to allow a desired set of operations, including the universal C-NOT gate. If the barrier between Dots 2 and 3 is lowered (by a relatively large amount), tunneling can be induced from Dot 2 to Dot 3. A measurement of the energy required to induce the tunneling determines whether Dot 2 was spin-up or spin-down. This measurement is "strong." The three dots are sufficient for construction of a C-NOT gate which can have a basic operation as follows. The three dots are allowed to relax in a DC magnetic field of 2–5 T perpendicular to the semiconductor wafer for a time which is long compared to the environmental decoherence time, which is estimated to be in the range of 1 second to 1 millisecond. The three spins of the three dots are all in the "up" state at that point. The system is then bathed in a field $H_o$ operating at about 50 GHz. Spin 1 is shifted electrostatically into a Ge-rich region until its resonant frequency matches the applied frequency, and is then held there for a time $t=h/4\mu_B H_o$, and is then brought out of resonance, i.e., it is subjected to a $\pi/2$ pulse. Then, a similar operation is carried out on spin 2. Following this, the barrier between spins 1 and 2 is electrostatically lowered by a relatively small amount, forcing spins 1 and 2 to interact via $H(t)=J(t)S_1 \cdot S_2$. The gate is timed such that this interaction lasts a time $t=h/4Jo$ (this is for a square pulse; more generally, the time integral of J(t) should be h/4). This is the square root of the swap operator in which the two spin directions are interchanged. Spin 1 is then subjected to a $\pi$ pulse. Finally, the square root swap is repeated. The sequence of five operations is the complete C-NOT logic gate, the operation of which is illustrated schematically in FIG. 7 showing the timing sequences for the operation of the gate. Spins 1 and 2 (the top two lines) are subjected to rotations (the lined boxes) and mutual interactions (represented by the wavy lines). V1 and V2 are the voltages on gates adjacent to Dots 1 and 2, respectively, while V3 is the voltage on the gate between them.

Figure 8:
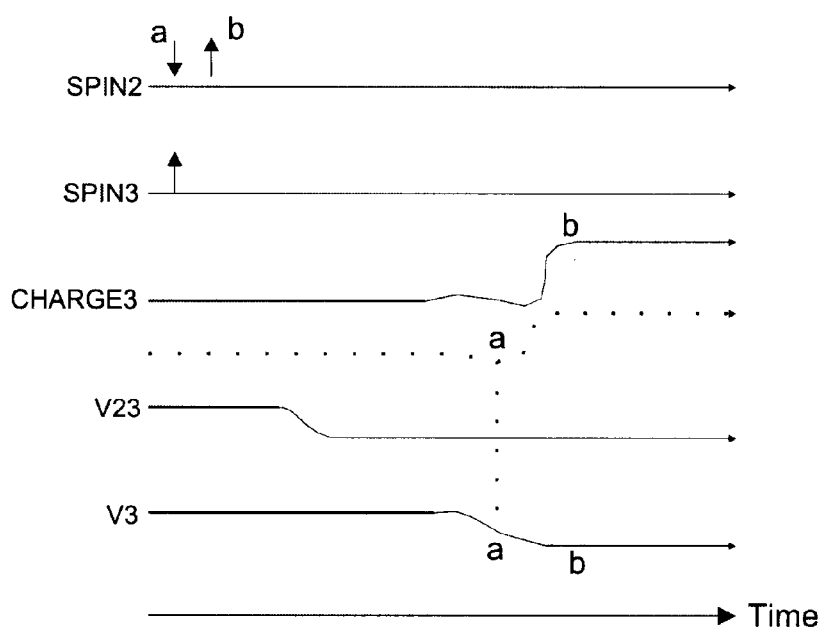
FIG. 8 are timing diagrams showing the detailed gate-voltage sequence for the operation of the protocol for readout of the qubit state in accordance with the invention.

Readout on spin 2 is performed by lowering the barrier between spins 2 and 3 by a relatively large amount in an asymmetric fashion. The asymmetry gives rise to the possibility that spin 2 (or rather the electron in Dot 2) will tunnel into Dot 3. Spin 3 has remained in the "up" state. Hence, tunneling will be relatively inhibited by the Pauli principle if spin 2 is also up. Thus, by detecting the motion of the charge or the absence of motion, the state of spin 2 can be read out. This sequence is illustrated graphically in FIG. 8. Spin-down electrons (a) tunnel more readily into the readout dot (Spin 3) whose spin is up. Consequently, after the barrier between Dots 2 and 3 (V23) is lowered, a gradual lowering of the back gate voltage on Dot 3 results in tunneling a spin-down electron sooner, and this is read out as an increase in CHARGE3.

The heterostructure design of FIGS. 2 and 3 requires strain relaxed high germanium concentrations. There are two available approaches that enable strain relaxed high germanium concentration epitaxial growth. The first is to grow high Ge concentration alloys (up to pure Ge) on Si (001) that relax through misfit dislocation generation. By growing compositionally graded films, the resulting films can have dislocation densities as low as $1\times10^6/cm^2$. This low threading dislocation density will insure that most patterned dots will be defect free. A second approach is to use Ge (001) as the starting substrate.

The multiple semiconductor layers can be grown with conventional deposition systems, including low pressure chemical vapor deposition (CVD) reactors that use $SiH_4$ and $GeH_4$ to grow SiGe films. Such systems are also available with in situ differentially pumped RHEED systems for film characterization, and with equipment to allow flow of diborane and phosphene for both p-type and n-type doping during growth. Molecular beam epitaxy systems with SiGe evaporators capabilities may also be utilized. Low energy electron microscopy can be used to provide in situ characterization of the SiGe structures.

In the present invention, electrons can tunnel from the back gate 41 to the quantum dots whenever it is energetically favorable to do so. This differs from most prior laterally coupled two dot systems, which usually do not allow tunneling to and from a back gate. In the present invention, in order to induce an electron to tunnel specifically from Dot 1 into Dot 2, that process must be more favorable than a process in which the electron tunnels from the back gate 41 into Dot 2. In the present invention, electrostatic forces aid the process. There is a capacitive coupling between Dot 1 and Dot 2. It is possible to change the gate voltages such that Dot 2 will require a second electron to lower its energy, but only if Dot 1 is empty. To understand this cross-coupling, it is useful to note that Dot 1 is in fact an additional gate from the perspective of Dot 2. The occupation of Dot 1 by an electron is exactly equivalent to a negative gate voltage on this "effective gate." If the gate voltages are adjusted so that Dot 2 desires an electron only if Dot 1 is empty, the only energetically allowed tunneling event is for the electron in Dot 1 to tunnel into Dot 2. This simultaneously empties Dot 1 and gives double occupancy to Dot 2.

For voltage manipulations and measurements at high speed, a combined scanning far-/near-field microwave probe may be formed, using micromachining techniques, which is based on the probe positioning and imaging capabilities of the scanning force microscope. A shielded silicon/polysilicon coaxial tip geometry can be combined with a broadband transmission line integrated along a scanning force microscope cantilever. This approach allows non-contact nanometer spatial and picosecond temporal resolution of local electric fields.

Nonlinear transmission lines are the only presently available technology for generating pico- and subpicosecond pulses that does not require lasers and photoconductive switches, and can be utilized for excitation and clock distribution. Integrated nonlinear transmission lines are limited by waveguide dispersion, interconnect metalization losses and diode resistive losses. Such transmission lines can be built to generate about 500 femtosecond step waveforms at room temperature, and can be integrated with planar monopole, slot and bowtie antennas to radiate the ultrashort pulses into free space. Planar bowtie antennas offer important advantages over other competing broadband planar antennas, but have limitations as well. They are simple to design and offer, in principle, a frequency independent impedance. In addition, unlike longer log-periodic or log-spiral antennas, bowtie antennas do not necessarily exhibit phase dispersion. Thus, while such planar antennas are more efficient broadband radiators, they distort the phase of the signal, making them much less useful for clocking applications. The primary disadvantage of the bowtie antenna is its bi-lobed radiation pattern, which can be partially compensated with off-axis focussing through a substrate lens. The antenna and enclosure system may be arranged to distribute a suitably shaped clock waveform to an array of qubits in a uniform way.

Figure 9:
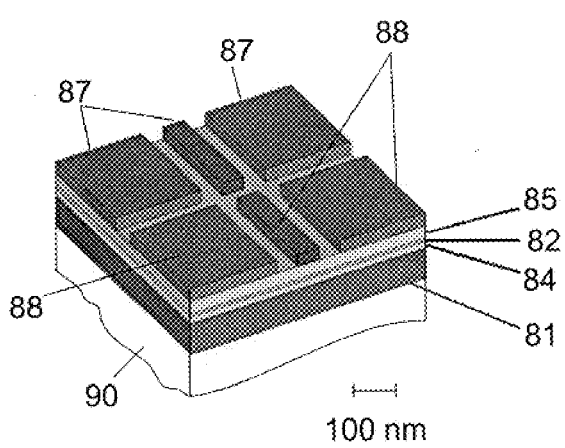
FIG. 9 is a simplified perspective view of a quantum dot semiconductor device in accordance with the invention.
Figure 10:
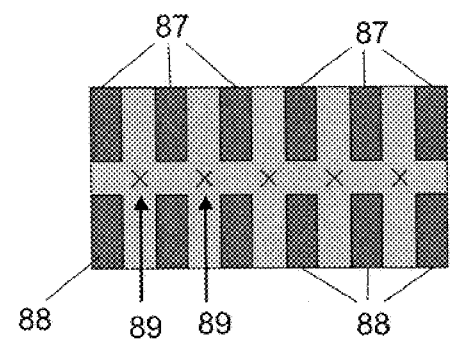
FIG. 10 is a plan view of a multiple quantum dot device having the structure of FIG. 9.

A variation on the structure 30 of FIGS. 1 and 2 is shown at 80 in FIGS. 9 and 10. It incorporates a back-gate 81 that serves as an electron reservoir, a quantum well 82 that confines electrons vertically, a tunnel barrier 84, a top barrier 85 and split top electrode gates 87 and 88 formed spaced from each other and that provide lateral confinement by electrostatic repulsion to define quantum dots 89 in the intergate region. A single quantum well layer 82 is utilized in this device as compared to the two quantum well layers 44 and 45 of the device shown in FIG. 2. The device 80 is grown on a relaxed $Si_{1-x}Ge_x$ substrate 90, prepared by graded compositional growth on a Si wafer. The back-gate 81 is formed of n-doped $Si_{1-x}Ge_x$, followed by an undoped $Si_{1-x}Ge_x$ barrier layer 84. A pure Si quantum well 82 is grown pseudomorphically onto the relaxed barrier, followed by another $Si_{1-x}Ge_x$ barrier layer 85. Finally, the metallic top gates 87 and 88 are patterned lithographically. (Not shown in FIG. 9 is a silicon capping layer such as the layer 48 of FIG. 2.) Here, we consider x=0.077, consistent with a conduction band offset of ~84 meV in the quantum well.

A particular feature of this device, as in the device 30 of FIGS. 1 and 2, is the combined use of vertical tunnel-coupling through the back gate 81, together with lateral coupling, defined by the split top gates 87 and 88. To load a single electron into a dot, a negative bias between the surface and back gates is applied, depleting any electrons from the quantum well. The bias is then slowly relaxed until a single electron tunnels from the back gate into the quantum dot. In contrast with conventional, laterally coupled dots, we emphasize that no electrical connections are made to the quantum well layer.

The time evolution of the qubits is controlled by the exchange interaction, which is the spin-dependent part of the coulomb interaction. For a two-electron system the exchange interaction can be expressed as $H_s(t)=J(t)S_1 \cdot S_2$, with the time-evolution operator, $U(t)=\exp[i\int H_s(\tau)d\tau/\hbar]$. The exchange coupling, J, is only appreciable when electron wavefunctions are made to overlap. It can be extinguished by raising an electrostatic barrier between the electrons, forcing them to separate. By making use of coded qubit techniques, the exchange coupling can be used as the basis for both two-qubit gate operations such as "root-swap", as well as one-qubit operations like rotations. Since all quantum gates, including the controlled (C)-NOT, can be expressed as combinations of such basic operations, the exchange coupling becomes a universal control element for quantum dot quantum computing.

The mapping $J(V_1,V_2,\ldots)$ between the potentials on the top-gates and the exchange coupling succinctly characterizes the operation of the quantum computer. We have computed this mapping numerically for the device shown in FIG. 9, obtaining an exact solution for the case of one electron per dot. The exchange coupling is determined as the difference between the ground and first excited states energies: $J=E_{trip}-E_{sing}$. "Singlet" and "triplet" refer to the spin symmetry of the two-electron wavefunction. Significant numerical accuracy is required in the calculations because of the large difference in energy scales: $J/E_{trip}<5\times10^{-4}$. In this simulation, the tunnel barrier 84 is 10 nm thick, the quantum well 82 is 6 nm, the barrier 85 is 20 nm, and the top gates are lithographically patterned metal.

Figure 11:
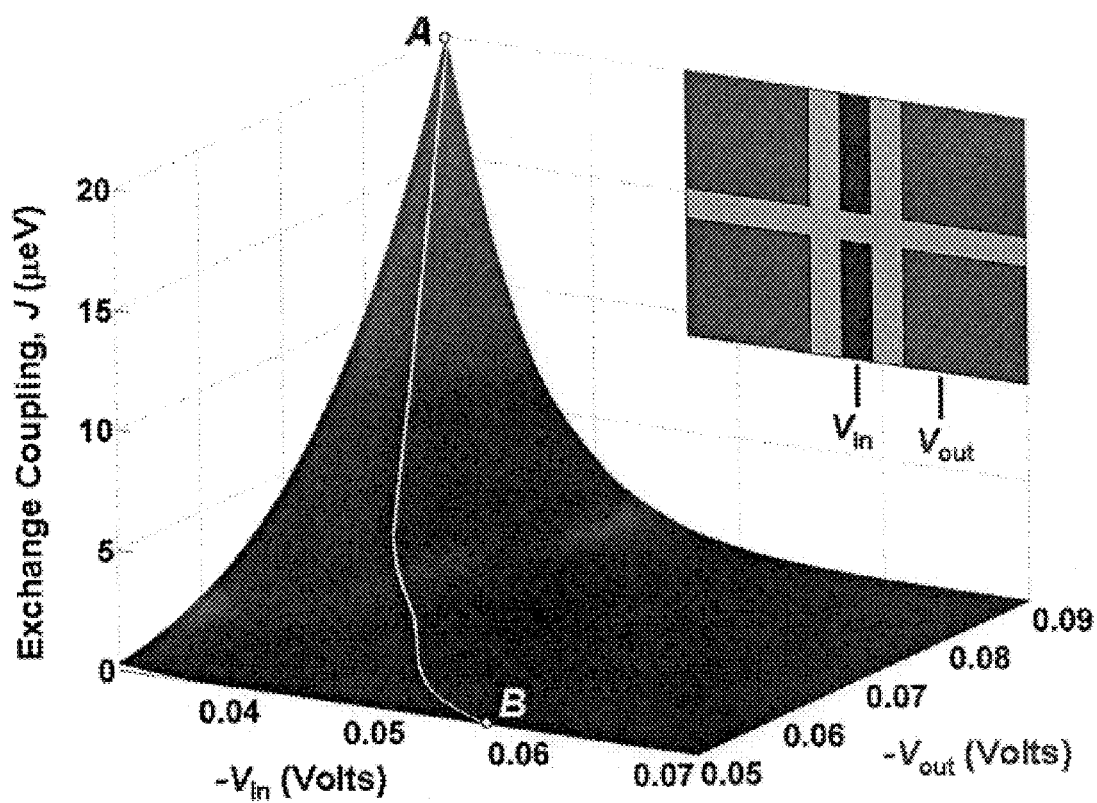
FIG. 11 is a graph showing the exchange coupling J, computed for a simplified quantum dot device of the type shown in FIG. 9, as a function of top gate potentials $V_{out}$ and $V_{i}$n.
Figure 12:
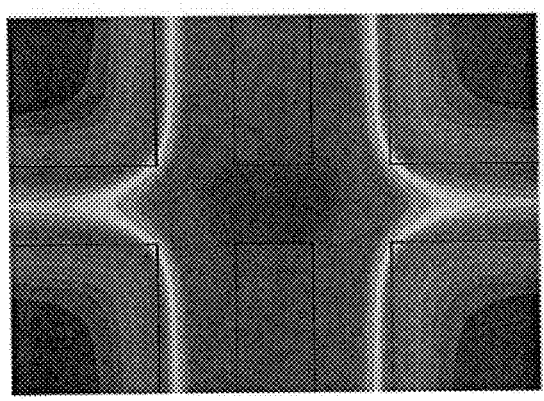
FIG. 12 is a computed map of electrostatic potential for the device of FIG. 9 at the point A of FIG. 11, computed at the middle of the quantum well.
Figure 13:
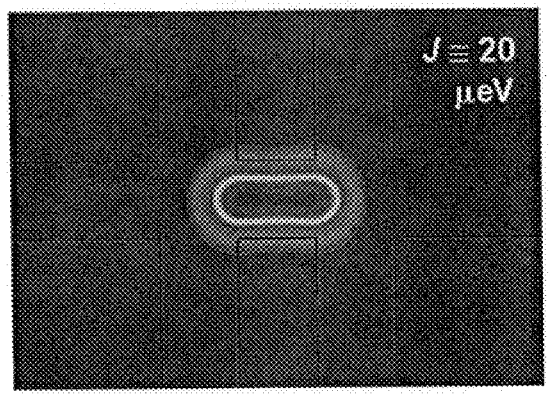
FIG. 13 is a computed map of charge density for the device of FIG. 9 at the point A of FIG. 11, computed at the middle of the quantum well.

Results of the simulation are shown in FIG. 11. To simplify the analysis, only two independent gate potentials, $V_{out}$ and $V_{in}$, were considered, corresponding to voltages on the outer four and inner two top-gates, respectively. The back-gate is grounded. The results are obtained for a range of gate potentials. The observed trends are consistent with previous studies, which use more idealized confinement potentials. When the electrostatic barrier between the quantum dots is low ($|V_{in}|<<|V_{out}|$) the exchange coupling is relatively large. For a high barrier ($|V_{in}|>>|V_{out}|$), the exchange coupling becomes exponentially small. For the case of zero magnetic field, assumed here, the exchange coupling does not cross zero, in contrast with predictions for high fields. However J can always be made arbitrarily small, by creating a large barrier. Indeed, this is a preferable technique for controlling "switch-off" errors.

FIGS. 12–15 provide insight into the operation of the device. Results are shown for two configurations of the gate potentials, corresponding to points A and B in FIG. 11. For the case of a low barrier (A), the potential landscape becomes an elongated trough, causing an overlap of the electronic wavefunctions and an increase in the exchange coupling (J≡20 μeV). Conversely, for a high barrier (B), the potential wells and the electrons are separate and distinct, with a vanishing exchange coupling. Because of their proximity, the image charges in the back-gate are more important than those in the top-gates. Consequently, the Coulomb interactions between trapped electrons are screened over length scales greater than 25 nm. The net effect is to amplify the features of the potential landscape in FIGS. 10—13 and the switching characteristics of J. The image charges are therefore desirable; the control of screening forms a useful design tool.

Errors will arise during the course of a quantum computation, some of which can be repaired, and some that cannot. The latter case is known as "leakage," in which a trapped electron is excited into a mode outside the two-dimensional qubit Hilbert space. Since leakage typically cannot be corrected by error correction techniques (quantum "software"), it must be controlled via hardware design. The idea is to create an environment where the most dangerous excitations (low-lying orbital modes) occur well above the thermal energy scale. Fortunately, most excitations are separated from the ground state by at least 1 meV (10 K). For example, p-type excited states, with nodal planes perpendicular to the [001] axis, occur approximately 1.5 meV (15 K) above the ground state. The excited subbands are split off by much larger energies, of order 20 meV. None of these modes poses any danger for low temperature operation. However, going beyond the single envelope function approximation, we uncover a splitting of the ground state due to a weak conduction valley-orbit coupling, in the presence of a quantum well. Such valley interference effects are known to cause erratic behavior in J. For the device described above, the splitting is of the order 0.1 meV (1 K), but can be increased by a factor of 5–10 through appropriate modification of the heterostructure architecture. Consequently, at sufficiently low temperatures, all orbital leakage can be suppressed.

Figure 16:
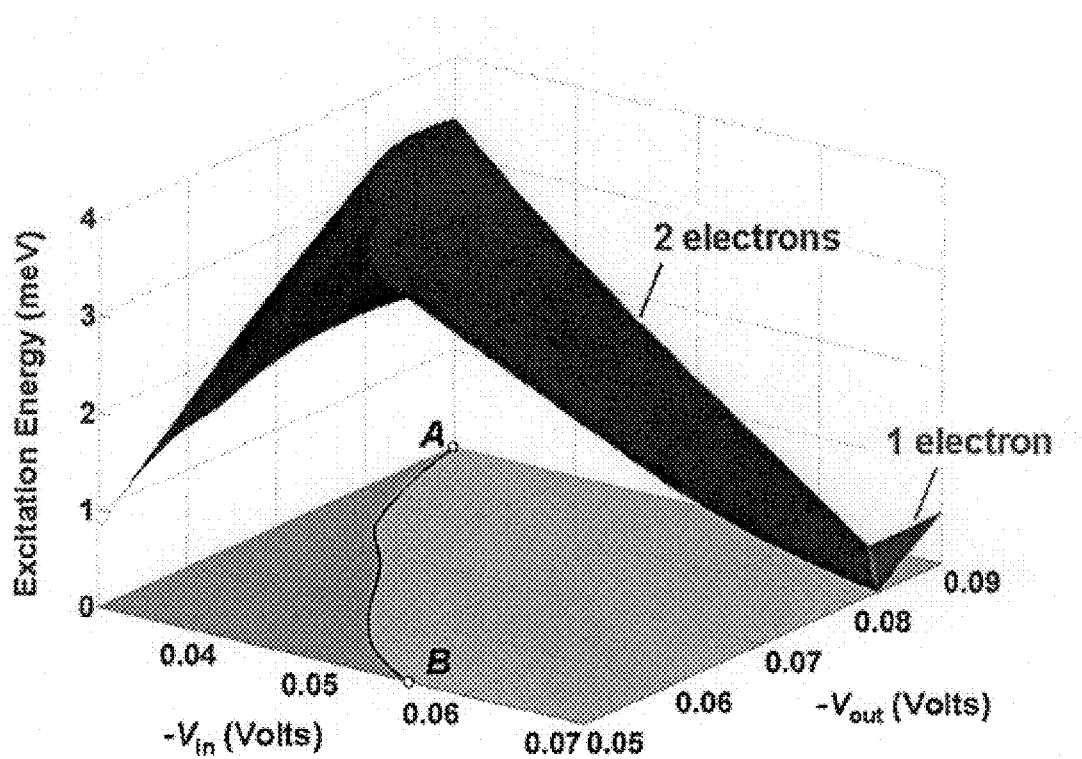
FIG. 16 is a graph showing the excitation energy for changing the quantum dot occupation number computed for the device of FIG. 9 for a range of gate potentials $V_{in}$ and $V_{out}$.

A second type of leakage error is associated with fluctuations in the number of electrons in a dot. For any spin qubit, the number of electrons per qubit must be controlled precisely. In the device of the invention, the same gates that control the electron positions and the exchange coupling also raise or lower the energy of the trapped electrons with respect to the tunnel-coupled back-gate. Normal gating procedures can therefore cause electrons to tunnel. FIG. 16 is a plot of the excitation energy for an electron in a double dot to tunnel into (or out of) the back-gate. The desired occupation number of two (one electron per dot) remains stable over a wide range of gate potentials. Maximum stability (3–4 meV) occurs along the curve AB. The band offset for the quantum well, $\Delta E_c$, turns out to be an important, tunable parameter for this calculation.

Quantum computing errors that can be repaired fall into two categories: decoherence errors, characterized by a coherence time, $\tau_\phi$, and small gating errors that accumulate over many operations. Fault-tolerant techniques have been developed to correct the errors, but these are only effective for error levels up to $10^{-4}$ or one accumulated error per $10^4$ operations. In the coded qubit scheme, a single qubit operation (like C-NOT) is composed of a sequence of exchange coupling primitives (like swap). The error level for such primitives should be about $10^{-5}$, at least until error correction techniques can be optimized for this scheme.

The coherence time, $\tau_\phi$, associated with environmental couplings is rather large for electron spins in Si. For donor-bound electrons in bulk Si at low temperatures and fields, the spin-lattice relaxation time, $T_1$, can be greater than 3000 s. Transverse spin relaxation, $T_2$, is a greater source of concern. Initially, there occurs a rapid but incomplete decay, which does not interfere with error correction techniques. Complete decay, over much longer time scales, involves contributions from the hyperfine coupling with $^{29}$Si nuclei, and magnetic dipole interactions between the trapped electrons. Such phenomena can be controlled by utilizing, respectively, isotopically enriched $^{28}$Si, and compensation techniques developed for nuclear magnetic resonance in dilute spin systems. The limiting process for $T_2$ in a bulk Si device will likely be the spin-lattice interaction, so that $\tau_\phi \equiv T_2 \equiv T_1$.

When uniaxial strain is applied, $\tau_\phi$ grows by many orders of magnitude. Further enhancement is possible in quantum dots, because of the weak valley-orbit coupling. Consequently, spin decoherence in the device should be dominated by processes associated with the SiGe layers, rather than the Si well, because of the larger spin-orbit coupling in Ge. To provide an estimate, we multiply a characteristic decoherence rate for P donors in Ge ($T_1 > 0.001$s) by the probability of finding an electron at a Ge atom in the quantum barrier. This gives $\tau_\phi \equiv 1$s, although the actual value may be much larger, particularly at low temperatures and fields. Fault-tolerant error correction then requires a switching rate $>10^5$ Hz for exchange coupling operations.

Accurate gating involves two steps: initial characterization of the exchange coupling between pairs of qubits, and precise implementation of the gate operations. As a prototype for gate operations the root-swap can be considered, as implemented with a pulse signal, $V_s(t)$. The particular shape of $V_s(t)$ is arbitrary, although the integrated pulse must satisfy the relation $$\int_{\tau_s} J(V_s(t))dt = \pi\hbar/2. \qquad (1)$$

Here, $\tau_s$ is the switching time, and the function J(V) was computed in FIG. 11. Fault-tolerant error correction requires that Eq. 1 should be satisfied to an accuracy of $10^{-5}$.

The control pulse $V_s(t)$ can never be implemented perfectly. However, performance criteria can be specified for control electronics, based on simulations. An exchange pulse of fixed area can be shaped low and flat, such that errors in the pulse width are diluted to acceptable levels. For pulse width errors of 100 ps, available from commercial GHz pulse generators [e.g., from Agilent], error correction requires that $\tau^s > 10$ $\mu$s. Faster operation is possible, theoretically, but depends on tighter control of the pulse width. In general, low frequency (sub-MHz) generators generally exhibit better performance characteristics. In addition to pulse width errors, we must also avoid gating errors associated with non-adiabatic switching: the exchange coupling should be turned on slowly. For a flat-top pulse of width 10 $\mu$s, a minimum pulse edge of 10 ps is calculated. The flat-top shape is therefore realistic.

The error levels that can be tolerated in the applied gate potential is implementation-specific, and can only be determined via modeling. For a flat-top pulse of height $J = \pi \hbar / 2\tau_s$, fault tolerant error correction suggests a pulse height variation of $$\delta V < 10^{-5} J | \partial J / \partial V |. \tag{2}$$

To a good approximation, the function J(V) is exponential, $J = J_0 e^{-V/V_0}$, leading to the constraint $\delta V < 10^{-5} V_0$. Large nonlinearities in J(V) are consistent with smaller $V_0$, and tighter constraints on the voltage control. Fitting the exponential form for J to different regions in FIG. 11 yields $\delta V < 20-55$ nV, or $\delta V/V < 5-8 \times 10^{-7}$. For sub-MHz pulse generators, the desired accuracy levels fall nearly within the specifications of current, off-the-shelf electronics [e.g., from BNC]. We can expect that commercially available MHz technology will meet quantum computing specifications in the near future. For GHz operation, significant improvements will be required before Eq. 2 is satisfied.

The quantum dot structure can be optimized to increase $V_0$, which sets the scale for gating accuracy. It is also desirable to "digitize" the characteristically analogue gating function, J(V), by creating a bistable quantum dot design where $V_0$ is large in the switching tail.

Figure 17:
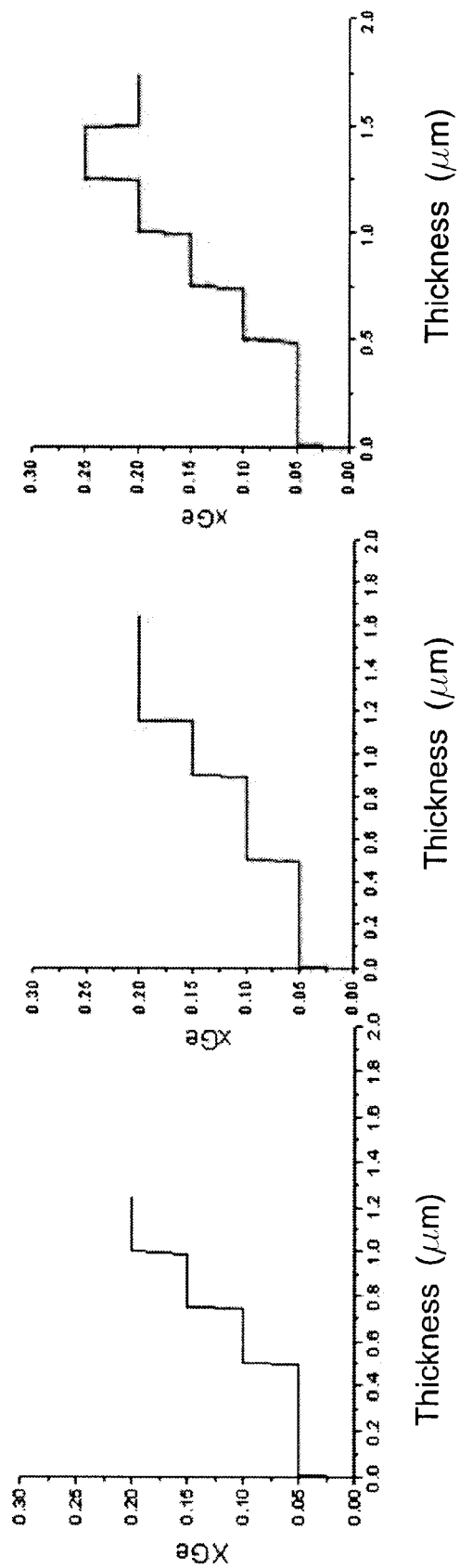
FIG. 17 are graphs showing step grading variations for a sequence of growth layers for a heterostructure as in FIG. 9.
Figure 18:
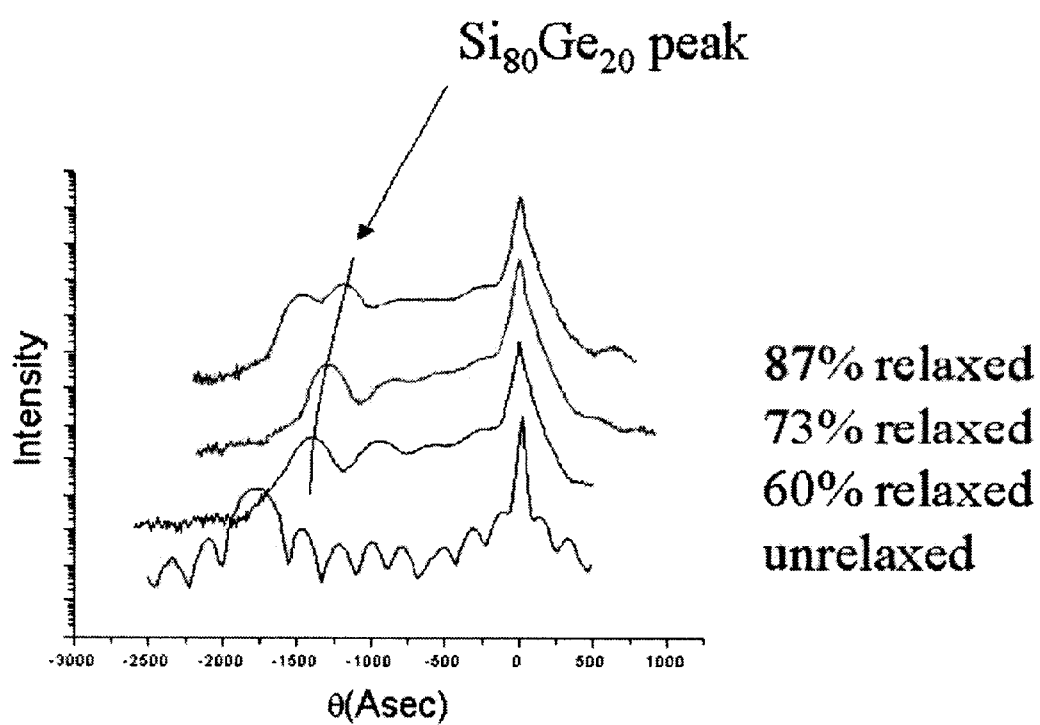
FIG. 18 are graphs showing the degree of strain relaxation with the step grading variations of FIG. 17.

The heterostructure of the device of FIG. 9 can be grown with various degrees of strain relaxation in the barrier layers surrounding the quantum well. FIG. 17 illustrates three growth layer sequences, and FIG. 18 illustrates the computed degree of strain relaxation for these sequences. Although discrete step changes in composition are shown in FIG. 17, relaxation can also be obtained with a continuous grading of the composition.

The dependence of J on the gate voltages can be improved by engineering the geometry of the quantum dots. It is very useful to have a pseudo-digital function J(V) as shown in FIG. 19, so that the gate voltages can be changed rapidly, possibly with large uncertainties in these gate voltages, and yet J remains well controlled with small uncertainty.

Figure 19:
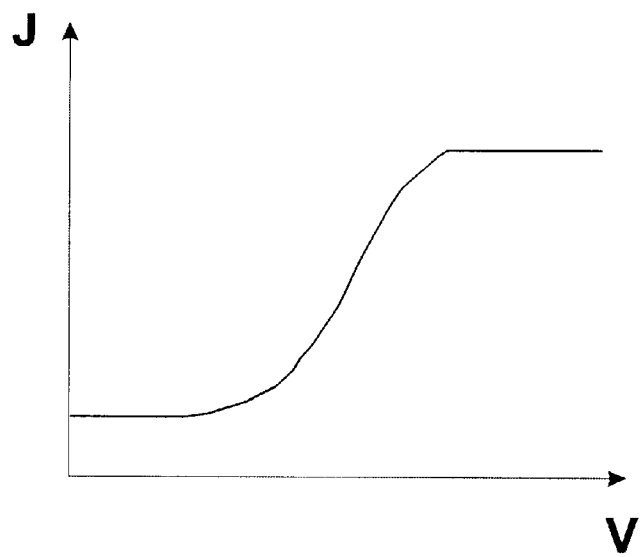
FIG. 19 is a graph showing a simplified pseudo-digital dependence of the exchange coupling J on the gate voltage V.
Figure 20:
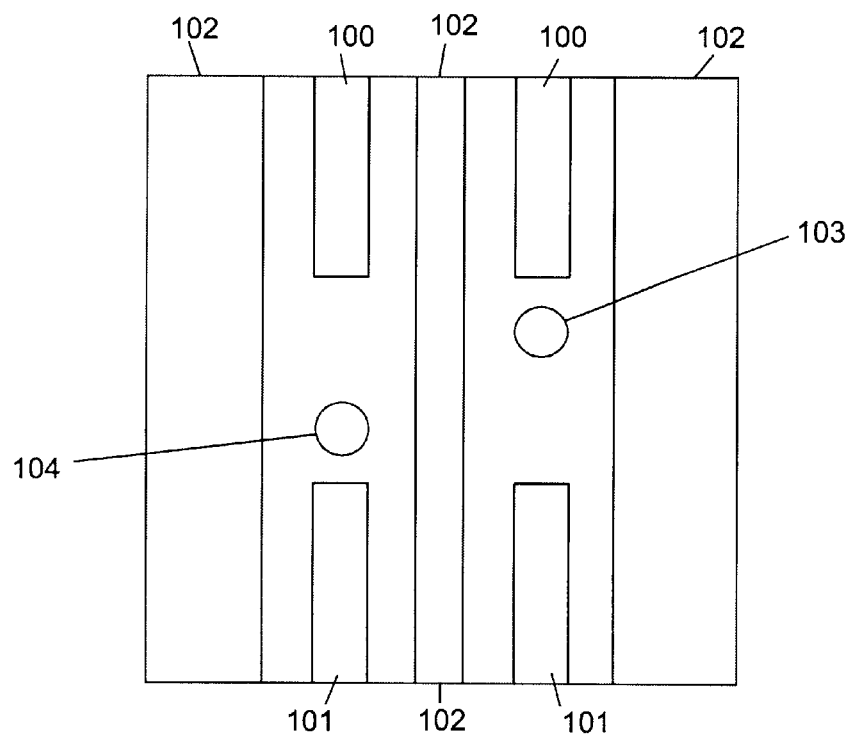
FIG. 20 is a top view of patterned control electrode gates.

The exchange coupling J(V) can be "digitized," as in FIG. 19, by allowing the trapped electrons (qubits) to slide past one another. There is a point of closest approach, at which point the function J(V) is a maximum and therefore has zero slope. FIG. 20 illustrates this concept. Adjustable voltages, applied to top and bottom control electrode gates 100 and 101 that extend to terminal positions spaced from each other by a region beneath which quantum dots may be defined, cause the electrons trapped in this double-dot to slide up or down. Fast-changing voltages may be provided individually to the electrode gates 100 and 101 from a voltage supply in the manner illustrated in FIG. 5. Electrode gates 102 extend on both sides of the gates 100 and 101 and are supplied with precisely defined voltages. For example, asymmetric voltages can be applied to the adjacent pairs of gates 100 and 101 to push the right hand qubit 103 upwardly and the left hand qubit 104 downwardly. For the case of a large separation between the two qubits, the exchange interaction is small. As the gate voltages are reduced, the electrons slide towards each other, finally aligning with one another. In this way, a maximum occurs in J(V), such that J(V) becomes flat topped, and $|\partial J / \partial V| = 0$.

Figure 21:
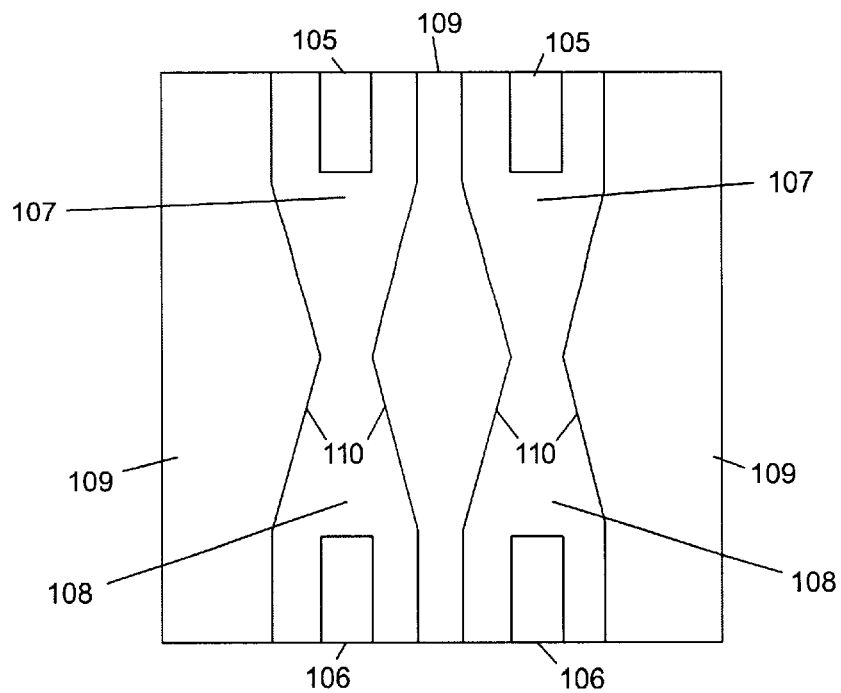
FIG. 21 is a top view of another design for patterned control electrode gates providing a bistable qubit design.

This mechanism can also be implemented with a truly bistable qubit design. FIG. 21 shows such a bistable, "bowtie" design for a double-dot in which the control gates 105 and 106 squeeze the electron into either the top part 107 or the bottom part 108 of the quantum dot between side electrode gates 109 that have inwardly extending portions 110 that squeeze the quantum dots. When the voltages on the gates 105 and 106 on the left and right hand dots are symmetric, the electrons align and a maximum in J(V) is achieved. When voltages on the adjacent pairs of gates 105 and 106 are not symmetric, the quantum dots are pushed to the opposite sides of the structure, the exchange coupling J is small.

Figure 22:
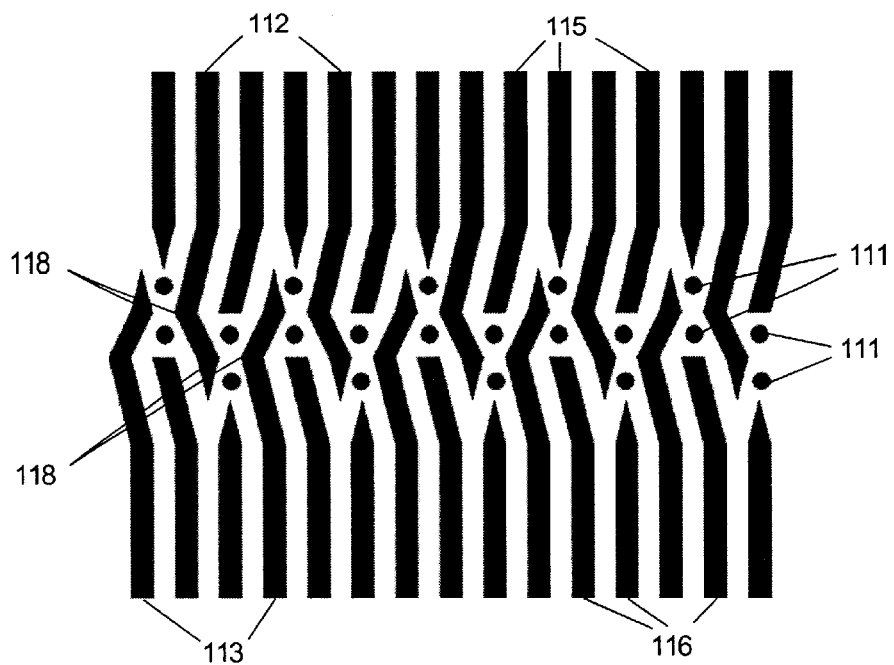
FIG. 22 is a scaled-up array of the control electrode gates of the type shown in FIG. 21 wherein each qubit has a pseudo-digital exchange coupling J with its neighbors, and wherein each vertical pair of circles represents a single qubit.

FIG. 22 shows a scaled-up array of the qubits from FIG. 21. Each qubit has a pseudo-digital exchange coupling J with its neighbors. Each vertical pair of circles 111 in FIG. 22 represents a single qubit. The electrode gates include electrode gates 112 and 113 that extend to positions between quantum dots and electrode gates 115 and 116 that extend to positions spaced from each other on opposite sides of each quantum dot. As shown in FIG. 22, the gates 112 and 113 preferably have inwardly extending portions 118 that squeeze the qubits as in FIG. 21, and can have an appropriate bias voltage applied thereto, and the gates 116 that face each other may be supplied with time varying voltage as discussed above. The electron (for example) that carries that qubit's information would reside in either the top or the bottom circle corresponding to its qubit location. Thus, there are 10 qubits represented in this diagram, but there are 20 possible locations for electrons to reside. Neighboring electrons reside in the central dot positions to achieve maximum J. Electrons reside in the upward or downward shifted positions to achieve small J. Thus, this arrangement provides a scaled up array of pseudo-digitally coupled qubits.

It is understood that the foregoing description is for purposes of exemplifying the invention, and that the invention is not limited to the embodiments set forth herein for illustration, but embraces all such forms thereof as come within the scope of the following claims.

What is claimed is:

1. A semiconductor quantum dot device comprising:
   (a) a multi-layer semiconductor structure including a semiconductor substrate, a back gate electrode layer, a quantum well layer, a tunnel barrier layer between the quantum well layer and the back gate layer, and an upper barrier layer above the quantum well layer; and
   (b) a plurality of spaced electrode gates formed on the multi-layer semiconductor structure, the electrode gates spaced from each other by a region beneath which quantum dots may be defined.

2. The quantum dot device of claim 1 whereby the multi-layer semiconductor structure is a heterostructure.

3. The quantum dot device of claim 1 wherein the semiconductor structure includes a capping layer as a top layer and wherein the gates are formed on the capping layer.

4. The quantum dot device of claim 3 wherein the capping layer is formed of silicon.

5. The quantum dot device of claim 3 wherein the capping layer is formed of gallium-arsenide.

6. The quantum dot device of claim 1 wherein there are at least two pairs of opposed gates.

7. The quantum dot device of claim 1 wherein the substrate is formed of silicon-germanium, the back gate layer is formed of doped silicon-germanium, and the barrier layers are formed of silicon-germanium.

8. The quantum dot device of claim 7 including a capping layer formed of silicon as the top layer formed over the barrier layer, the gates formed on the capping layer.

9. The quantum dot device of claim 7 wherein the quantum well layer comprises two layers of semiconductor material, one layer of silicon-germanium and another layer of germanium.

10. The quantum dot device of claim 7 wherein the quantum well layer is formed of pure silicon.

11. The quantum dot device of claim 7 wherein the silicon-germanium barrier layers are formed with a graded silicon-germanium composition for strain relaxation.

12. The quantum dot device of claim 11 wherein the composition of the barrier layers is graded in discrete steps.

13. The quantum dot device of claim 7 wherein the quantum well layer has a thickness of about 6 nm, and the barrier layers have a thickness in the range of 10 to 20 nm.

14. The quantum dot device of claim 1 wherein the substrate is formed of gallium-arsenide, the back gate is formed of doped gallium arsenide, and the barrier layers are formed of aluminum-gallium-arsenide.

15. The quantum dot device of claim 14 including a capping layer formed of gallium arsenide as a top layer formed over the barrier layer, the gates formed on the capping layer.

16. The quantum dot device of claim 14 wherein the quantum well layer is formed of gallium arsenide.

17. The quantum dot device of claim 16 wherein the quantum well layer has a thickness of about 15 nm, and the barrier layers have a thickness in the range of 10 to 30 nm.

18. The quantum dot device of claim 1 further including a bias voltage supply connected to the back gate layer to apply a bias voltage thereto and a voltage source connected to apply selected voltages to one or more of the electrode gates.

19. The quantum dot device of claim 18 including a charge sensor coupled to a gate to detect changes in charge.

20. The quantum dot device of claim 19 wherein the charge sensor includes an FET having a gate that is electrically connected to the gate of the quantum dot device.

21. The quantum dot device of claim 1 wherein the electrode gates are spaced from each other a distance in the range of 10 nm to 50 nm.

22. The quantum dot device of claim 1 wherein there are an array of quantum dots, and the electrode gates include gates that extend to positions between quantum dots and have inwardly extending portions that squeeze qubits and further including electrode gates that extend to positions spaced from each other on opposite sides of each quantum dot.

23. A semiconductor quantum dot device comprising:
    (a) a multi-layer semiconductor structure including a semiconductor substrate, a back gate electrode layer, a quantum well layer, a tunnel barrier layer between the quantum well layer and the back gate layer, and a barrier layer above the quantum well layer;
    (b) a plurality of spaced electrode gates formed on the multi-layer semiconductor structure, the electrode gates spaced from each other by a region beneath which quantum dots may be defined; and
    (c) a bias voltage supply connected to the back gate layer to apply a bias voltage thereto and a voltage source connected to apply selected voltages to one or more of the electrode gates.

24. The quantum dot device of claim 23 whereby the multi-layer semiconductor structure is a heterostructure.

25. The quantum dot device of claim 23 wherein the semiconductor structure includes a capping layer as a top layer and wherein the gates are formed on the capping layer.

26. The quantum dot device of claim 25 wherein the capping layer is formed of silicon.

27. The quantum dot device of claim 25 wherein the capping layer is formed of gallium-arsenide.

28. The quantum dot device of claim 23 wherein there are at least two pairs of opposed gates.

29. The quantum dot device of claim 23 wherein the substrate is formed of silicon-germanium, the back gate is formed of doped silicon-germanium, and the barrier layers are formed of silicon-germanium.

30. The quantum dot device of claim 29 wherein the quantum well layer comprises two layers of semiconductor material, one layer of silicon-germanium and another layer of germanium.

31. The quantum dot device of claim 29 wherein the quantum well layer is formed of pure silicon.

32. The quantum dot device of claim 29 wherein the silicon-germanium barrier layers are formed with a graded silicon-germanium composition for strain relaxation.

33. The quantum dot device of claim 32 wherein the composition of the barrier layers is graded in discrete steps.

34. The quantum dot device of claim 29 wherein the quantum well layer has a thickness of about 6 nm, and the barrier layers have a thickness in the range of 10 to 20 nm.

35. The quantum dot device of claim 29 including a capping layer formed of silicon as the top layer formed over the barrier layer, the gates formed on the capping layer.

36. The quantum dot device of claim 23 wherein the substrate is formed of gallium-arsenide, the back gate is formed of doped gallium arsenide, and the barrier layers are formed of aluminum-gallium-arsenide.

37. The quantum dot device of claim 36 including a capping layer formed of gallium arsenide as a top layer formed over the barrier layer, the gates formed on the capping layer.

38. The quantum dot device of claim 36 wherein the quantum well layer is formed of gallium arsenide.

39. The quantum dot device of claim 36 wherein the quantum well layer has a thickness of about 15 nm, and the barrier layers have a thickness in the range of 10 to 30 nm.

40. The quantum dot device of claim 23 including a charge sensor coupled to a gate to detect changes in charge.

41. The quantum dot device of claim 40 wherein the charge sensor includes an FET having a gate that is electrically connected to the gate of the quantum dot device.

42. The quantum dot device of claim 23 wherein the electrode gates are spaced from each other a distance in the range of 10 nm to 50 nm.

43. The quantum dot device of claim 23 wherein there are an array of quantum dots, and the electrode gates include gates that extend to positions between quantum dots and have inwardly extending portions that squeeze qubits and further including electrode gates that extend to positions spaced from each other on opposite sides of each quantum dot.

* * * * *

UNITED STATES PATENT AND TRADEMARK OFFICE
CERTIFICATE OF CORRECTION

PATENT NO.    : 6,597,010 B2
DATED         : July 22, 2003
INVENTOR(S)   : Mark A. Eriksson et al.

It is certified that error appears in the above-identified patent and that said Letters Patent is hereby corrected as shown below:

Column 3,
Line 11, please delete "$V_in$" and replace it with -- $V_{in}$ --.

Column 12,
Line 34, please delete "$\tau_\phi \equiv T_2 \equiv T_1$" and replace it with -- $\tau_\phi \cong T_2 \cong T_1$ --.
Line 44, please delete "$\tau_\phi \equiv 1s$" and replace it with -- $\tau_\phi \cong 1s$ --.

Column 13,
Line 4, please delete "$\tau^s > 10$" and replace it with -- $\tau_s > 10$ --.
Lines 21-22, within the equation, please delete "$10^-{}_5$" and replace it with -- $10^{-5}$ --.
Line 25, within the equation, please delete the space between "55 nV" to read -- 55nV --.

Signed and Sealed this

Fourth Day of November, 2003

JAMES E. ROGAN
*Director of the United States Patent and Trademark Office*